(12) United States Patent
Shearman et al.

(10) Patent No.: US 6,376,779 B1
(45) Date of Patent: Apr. 23, 2002

(54) PRINTED CIRCUIT BOARD HAVING A PLURALITY OF SPACED APART SCRAP BORDER SUPPORT TABS

(75) Inventors: Simon E. Shearman, Almonte; Geoffrey G. Skanes, Richmond; Kyle G. Edginton, Nepean; Denis Kasprowicz, Ottawa, all of (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/644,703

(22) Filed: Aug. 24, 2000

(51) Int. Cl.⁷ .............................................. H01R 12/04
(52) U.S. Cl. ..................... 174/261; 361/751; 361/772; 361/816; 361/818
(58) Field of Search ................... 174/261, 250; 361/748, 749, 750, 791, 723, 816, 818, 767, 772, 775; 257/668, 12; 333/12, 81 B, 81 A, 246, 247

(56) References Cited

U.S. PATENT DOCUMENTS

| | | | |
|---|---|---|---|
| 5,023,754 A | * 6/1991 | Aug et al. | 361/415 |
| 5,466,893 A | * 11/1995 | Nakatani et al. | 174/261 |
| 5,991,162 A | * 11/1999 | Saso | 361/760 |
| 6,048,430 A | * 3/2000 | Johnston | 156/233 |
| 6,195,269 B1 | * 2/2001 | Hino | 361/816 |
| 6,240,635 B1 | * 6/2001 | Graves et al. | 29/840 |
| 6,259,609 B1 | * 7/2001 | Kurz | 361/818 |

FOREIGN PATENT DOCUMENTS

| | | |
|---|---|---|
| CA | 2149603 | 5/1995 |
| CA | 2142611 | 11/1998 |

* cited by examiner

Primary Examiner—Jeffrey Gaffin
Assistant Examiner—José H. Alcala

(57) ABSTRACT

A printed circuit board having a plurality of spaced apart scrap border support tabs along the perimeter. The board surfaces including the edges are coated with a conductive shielding material, except that each tab presents an uncoated, unshielded surface at the point of severance created by detachment of a scrap border subsequent to the coating application. The printed circuit board includes a plurality of spaced apart elongated apertures adjacent the perimeter, with each aperture being inwardly coincident to a respective one of each support tabs, each aperture defining an inner surface adjacent to the corresponding support tab with a portion of the inner surface being substantially parallel to adjacent perimeter portions of the circuit board, the inner surface of each aperture also being coated with the conductive shielding material with the latter being attached to the conductive shielding material of the board surface. A waveguide configuration is created which serves to attenuate electromagnetic emissions entering into or leaving the printed control board at the corresponding uncoated unshielded surface portions of the support tab during use of the printed circuit board. Frequencies in excess of 40 gigahertz may be attenuated.

10 Claims, 5 Drawing Sheets

PRINTED CIRCUIT BOARD HAVING A PLURALITY OF SPACED APART SCRAP BORDER SUPPORT TABS

FIELD OF THE INVENTION

The present invention relates to printed circuit boards and more particularly to high-frequency EMC containment therefor.

BACKGROUND OF THE INVENTION

Electronic components, including semiconductor components, integrated circuits and chips, carried on printed circuit boards are a source of electromagnetic interference or radio frequency disturbances when in use. Manufacturers of electronic devices must provide means to contain such electromagnetic interference or radio frequency disturbances when the devices are in use (EMC). For ease, both electromagnetic interference and radio frequency disturbances will be referred to as electromagnetic emissions.

Coating or "plating" a printed circuit board with a film of highly conductive material such as copper over all surfaces enables the printed circuit board to effectively operate electrically as a Faraday cage, and thereby constitute one means to contain such electromagnetic emissions.

To manufacture a conductively shielded, or "plated", printed circuit board, it is typical to provide the printed circuit board with extra material, or "scrap", which provides a location at which to support the printed circuit board during the plating step. The scrap border is typically connected to the printed circuit board by support tabs. Following plating, the scrap border is removed leaving the final printed circuit board.

However, the removal of the scrap border results in a "break" in the conductive shielding where the support tabs were severed, leaving the final board susceptible to electromagnetic emissions entering or leaving the board at the site of these support tabs.

One solution previously employed was to drill through a printed circuit board alternating rows of shielding holes, or vias, inward of each support tab. The vias are interiorly coated or filled with the conductive material. The vias come into contact with all ground layers in the printed circuit board, thereby connecting the ground layers to the top and bottom conductive layers of the printed circuit board. These vias attenuate frequencies of electromagnetic waves along their interior lengths, thereby effectively reducing the break in the conductive shield at the support tabs, and thus further reduce the chance of electromagnetic waves travelling on the inside surface of the top or bottom conductive surface of the printed control board from reaching and travelling along the outside surface and contributing to radiated emissions.

However, the attenuation of high frequency electromagnetic waves is problematic. As frequencies increase, the diameter and spacing of the vias must be decreased to accomplish signal attenuation. It is difficult to produce vias fine enough, or produce a fine enough piton to produce the vias, to attenuate signal energies in excess of 622 megahertz having regard to such factors as the thickness of printed circuit boards and manufacturing limitations.

Accordingly it is desirable to have an alternative means to attenuate high frequency signal energies on plated printed circuit boards.

SUMMARY OF THE INVENTION

The present invention seeks to provide a printed circuit board which minimizes the above problems.

According to one aspect of the invention, there is provided a printed circuit board having a plurality of spaced apart scrap border support tabs along the perimeter of the board. The board surfaces are coated with a conductive shielding material, except that each tab presents an uncoated, unshielded surface at the point of severance created by detachment of the scrap border subsequent to coating application. The printed circuit board includes a plurality of spaced apart elongated apertures adjacent to the perimeter, with each aperture being inwardly coincident to a respective one of each of the support tabs, each aperture defining an inner surface adjacent to the corresponding support tab with a portion of the inner surface being substantially parallel to the perimeter of the circuit board, the inner surface of each aperture also being coated with the conductive shielding material with the latter being attached to the conductive shielding material of the board surface, such that a waveguide configuration is created which serves to attenuate electromagnetic emissions entering into or leaving the printed control board at the corresponding uncoated unshielded surface portions of the support tab.

The invention defined above extends to all forms of multiple layer printed circuit boards including backplanes and panels used in electronic systems.

In another aspect of the invention there is a printed circuit assembly provided with a scrap border detachably connected to the perimeter of a printed circuit board by a plurality of spaced apart support tabs, all of which are coated with a conductive shielding material during manufacture. The scrap border is detached from the printed circuit board subsequent to coating by severance of the tabs whereby each tab presents an uncoated, unshielded surface at the point of severance. The printed circuit board includes a plurality of spaced apart elongated apertures adjacent to the perimeter of the board, with each aperture being inwardly coincident to a respective one of each of the support tabs. Each aperture defines an inner surface and an edge adjacent to the corresponding support tab, with a portion of the inner surface and the edge being substantially parallel to the perimeter of the circuit board, with the entire inner surface of each aperture also being coated with the conductive shielding material during manufacture, with the latter being attached to the conductive shielding material on the board surfaces such that a waveguide configuration is created which serves to attenuate electromagnetic emissions entering into or leaving the printed control board at the corresponding uncoated unshielded surface portions of the support tab.

In yet another aspect of the invention there is provided a method of manufacturing a printed circuit assembly having multiple layers in a sandwich arrangement comprising: providing a circuit assembly including a scrap border extending around and detachably connected to the perimeter of a centrally disposed printed circuit board by a plurality of spaced apart support tabs, fully coating the assembly with a conductive shielding material, and detaching the scrap border from the printed circuit board subsequent to coating by severance of the tabs, whereby each tab presents an uncoated, unshielded surface at the point of severance; the method being characterized by the formation in the centrally located printed circuit board of a plurality of spaced apart elongated apertures adjacent the perimeter, with each aperture being inwardly of the perimeter coincident to a respective one of each of the support tabs, and formed such that each aperture defines an inner surface and an edge adjacent to the corresponding support tab, with a portion of the inner surface and the edge being substantially parallel to the perimeter of the circuit board, with the coating step being carried out such that the inner surface of each aperture becomes coated with the conductive shielding material and attached to the conductive shielding material on the board surface such that a waveguide configuration is created which serves to attenuate electromagnetic emissions entering into or leaving the printed control board at the corresponding uncoated unshielded surface portions of the support tab.

Such an invention allows a plated printed control board to be EMC compliant at any operating frequency with signal energies up to and in excess of 40 gigahertz.

A separate enclosure around a printed circuit board carrying electronic components that can attenuate electromagnetic emissions may be used as another means to contain electromagnetic emissions. Such enclosures are typically referred to as Faraday cages.

Previously, Faraday cage enclosures surrounding a printed circuit board carrying electronic components on both major surfaces comprised two units which came into contact with each other. An electrically conductive gasket was applied on the edges of the two Faraday cage units to maintain electrical contact between the two units. However, it was difficult to maintain the gasket seal in circumstances where printed circuit boards comprising multiple layers were very thick.

An additional advantage of the present invention is that separate and independent Faraday shields which are EMC compliant, may be provided on each of the first (top) and second (bottom) major surfaces of a printed circuit board. These major surfaces carry the printed circuit board's electronic components which generate electromagnetic emissions when in use.

In another alternative embodiment, there is provided a housing assembly for a printed circuit board having first and second opposing major surfaces and a perimeter surface. Each surface is coated with a conductive shielding material. The board further has one or more ground planes disposed with the ground planes being in electrical contact with the first and second major surfaces of the board. The board is further provided with electronic components carried on each of the first and second surfaces. The housing assembly comprises a first housing in overlying spaced relationship to the first major surface and in electrical contact thereto all around the board perimeter such that a first Faraday cage is formed by said first housing and said first major surface of the board, and a second housing in overlying spaced relationship with the second major surface and in electrical contact thereto, all around the board perimeter such that a second Faraday cage is formed by said second housing and said second major surface of the board.

Such an aspect may also be used to facilitate heat dissipation.

More particularly, high speed digital components carried on printed circuit boards are dissipating more power in higher speed applications. These components are generating proportionately more heat while in use. It is necessary to remove this heat so as to prevent overheating which could damage and ultimately result in breakdown of one or more electronic components, which are often costly or difficult to replace.

Heats sinks have previously been employed for heat dissipation from electrical components in use. The heat sink is provided on the same side of a printed circuit board as the electronic components, such that electronic components lay between the printed circuit board and the heat sink. A typical heat sink includes a plate made up of thermally conductive material, such as aluminum, and a thermal interface to transfer the heat from the electronic component to the heat sink.

Since electronic components vary in size and shape, the distance between each electronic component and the heat sink also varies. Thermal interface material, or thermal overfill, is used to maintain thermal contact between the heat sink and the various "uneven heighted" electronic components carried on a printed circuit board. Typically, thermal overfill is often a paste-like material which can be used to fill the spaces between the electronic components and the heat sink surface, which subsequently hardens, forming a thermally conductive layer between the electronic components and the heat sink surface. However, since the thermal overfill material has a relatively low coefficient of thermal conduction, the thicker the overfill, the higher the junction temperatures that result, with the consequent risk of component damage or failure.

In high speed applications, printed circuit boards are often provided with electronic components on the top and bottom major surfaces.

Previously, thermal overfill material could be applied to both the top and bottom surfaces of the printed circuit board. However, for electronic components on the side of the board that is not directly fixed to the inside of the heat sink surface, the tolerances included the thickness of the printed circuit board, the electronic components, the machinery, etc., with the result that the thermal overfill material had to be very thick. The temperature rise over such thickness is generally too great for heat to be adequately conducted to the heat sink surface. This results in component junction temperatures higher than allowable, increasing the risk of component damage or failure.

High speed electrical components need as short a thermal conduction path as possible between their case and their heat sink surface.

Of note, Faraday cages made of or provided with thermally conductive material may also constitute a heat sink.

This further aspect of the invention allows high power digital components to be cooled effectively through the use of thermal overfill material which is applied to both major surfaces of a plated printed circuit board having substantially the same tolerances on both surfaces.

For the purposes of determining tolerances between the electronic components and the heat sink surface, each side of the printed circuit board operates independently. It is not necessary to account for the thickness of the printed circuit board on one or the other side of the printed circuit board. A very thin overfill can be used between the electronic component case and the heat sink surface.

Advantageously, components of higher power can be used and still run at the same heat-sink surface temperature. More power can be cooled by the same amount of air flow over the assembly. Therefore, more components may be added per module.

BRIEF DESCRIPTION OF THE DRAWINGS

Other aspects and features of the present invention will become apparent to those ordinarily skilled in the art upon review of the following description of specific embodiments of the invention in conjunction with the accompanying figures in which.

DETAILED DISCLOSURE OF THE EMBODIMENT(S)

Figure 1:
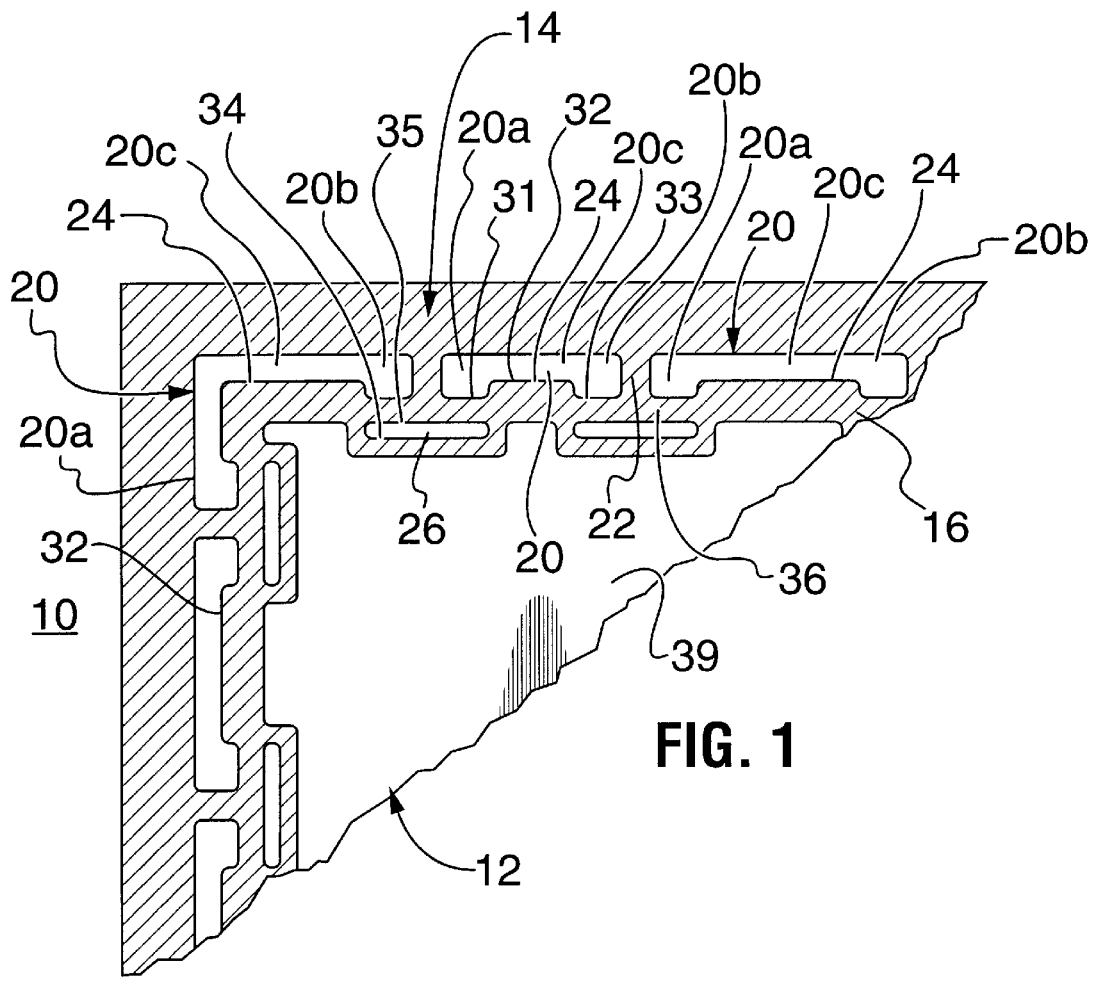
FIG. 1 is a top view of a corner portion of a printed circuit board assembly after plating, in accordance with an embodiment of the invention.

Referring to FIGS. 1 through 5, a printed circuit board assembly 10 comprises a final board 12 and a scrap border 14.

The final board 12 is a typical multiple layer printed circuit board in a sandwich arrangement having multiple internal signal layers (not shown), conductive layers for use as power planes (not shown), and conductive layers for use as ground planes (not shown). The signal layers and conductive layers are separated from one another by insulating layers. To provide some attenuation to electromagnetic emissions radiating from internal signal layers, the top 16 and bottom (not shown) outermost layers are also conductive layers. Typically, the top 16 and bottom (not shown) outermost conductive layers are connected to electrical ground potential when the circuit board is in operation.

The final board 12 provides a surface for the mounting of electronic components 18 such as integrated circuits which have associated plated-through holes (not shown) which provide for electrical communication between such electronic components with the signal layers (not shown) or conductive layers (not shown) of the final board 12, as required.

The scrap border 14 is a continuation of the final board 12 forming the perimeter region around the final board. The scrap border 14 contains special codes and also provides a location for handling during the manufacturing process including by mechanical fasteners.

During manufacture of the final board 12, it is conventional to initially use a larger process panel (not shown). The process panel is larger in plan view than the final board 12 and basically comprises the final board 12 and the scrap border 14 surrounding the perimeter of the final board 12. The process panel is constructed in layers using conventional techniques. Typically, all conductive layers intended to be used as ground planes extend beyond the dimensions of the final board into the scrap border region while the other conductive layers and the signal layers in conventional fashion stop short of the final dimensions of the final board 12.

At predetermined locations on the process panel, a plurality of in-series, spaced-apart outline slits 20 are made which extend through the process panel. Each outline slit 20 has an end region 20a, an intermediate region 20c and another end region 20b. The outline slits 20 are located and orientated such that their inwardly disposed side surfaces 24 of the intermediate regions 20c and the inner surfaces 32 of the end regions 20a and 20b form parts of the perimeter surface 28 of the final board 12, thereby defining a substantial outline of the final board 12.

Adjacent ends 20b and 20a of adjacent outline slits 20 flank and define support tabs 22. These support tabs 22 form bridges between the final board 12 and the scrap border 14. These support tabs 22 are required so that the final board 12 may be structurally supported to the scrap border 14.

The outline slits 20 are formed using conventional tooling methods. The depth A of each end region 20a and 20b of an outline slit 20 and the separation B between adjacent ends 20b and 20a of adjacent outline slits 20 defining the support tab 22 are based on such considerations as the ease of manufacture, the width B of the support tab required to provide sufficient support to the final board through all manufacturing steps and the standard router sizes available.

Referring to FIG. 1, each outline slit 20 is wider at each end region 20a and 20b than in the intermediate region 20c. When a router plunges into the process panel to form an outline slit 20, it results in a rough edge at the point of entry. To avoid having the router plunge into the process panel at a finished edge, which ultimately forms the perimeter surface 28 of the final board 12, widened portions are formed at the end regions of each outline slit 20a and 20b so as to provide smooth surfaces at all finished edges.

Formation of the outline slits 20 cuts through and exposes all conductive layers (not shown) along the inwardly disposed side surfaces 24 of the intermediate region 20c as well as the inner surfaces 32 of each end region 20a and 20b of an outline slit 20. Each outline slit 20 is to be wide enough to permit the flow of conductive coating material to plate the inner perimeter surfaces 28 of the final board 12 exposed by the inwardly disposed side surfaces 24 of the intermediate region 20c and the inner surfaces 32 of the end regions 20a and 20b.

Following detachment of the scrap border 14 from the final board 12, as will be described below, each end region 20a and 20b of an outline slit 20 will effectively be longitudinally divided into two, forming a furrow 21 extending from the top 16 to bottom (not shown) surfaces at the perimeter surface 28 of the final board 12. As a result, rather than supporting smooth, parallel perimeter surfaces 28 and edges 30, the final board 12 following severance of the scrap border 14 displays shallow recesses flanking each support tab 22.

Each end region 20a and 20b of an outline slit 20 has an inner surface 33 which is substantially parallel to the perimeter surface 28 of the final board 12, and is of a length C, although it is possible for each end region 20a or 20b of an outline slit 20 to have a depth A and length C equal to 0, being flush with the perimeter surface 28 of the final board.

Preferably, the size and shape of each end region 20a and 20b of an outline slit 20 will be the same. As will be appreciated, for reduced electromagnetic emissions, it would be advantageous for the width B to be kept to a minimum so as to produce narrow unshielded regions.

Figure 5:
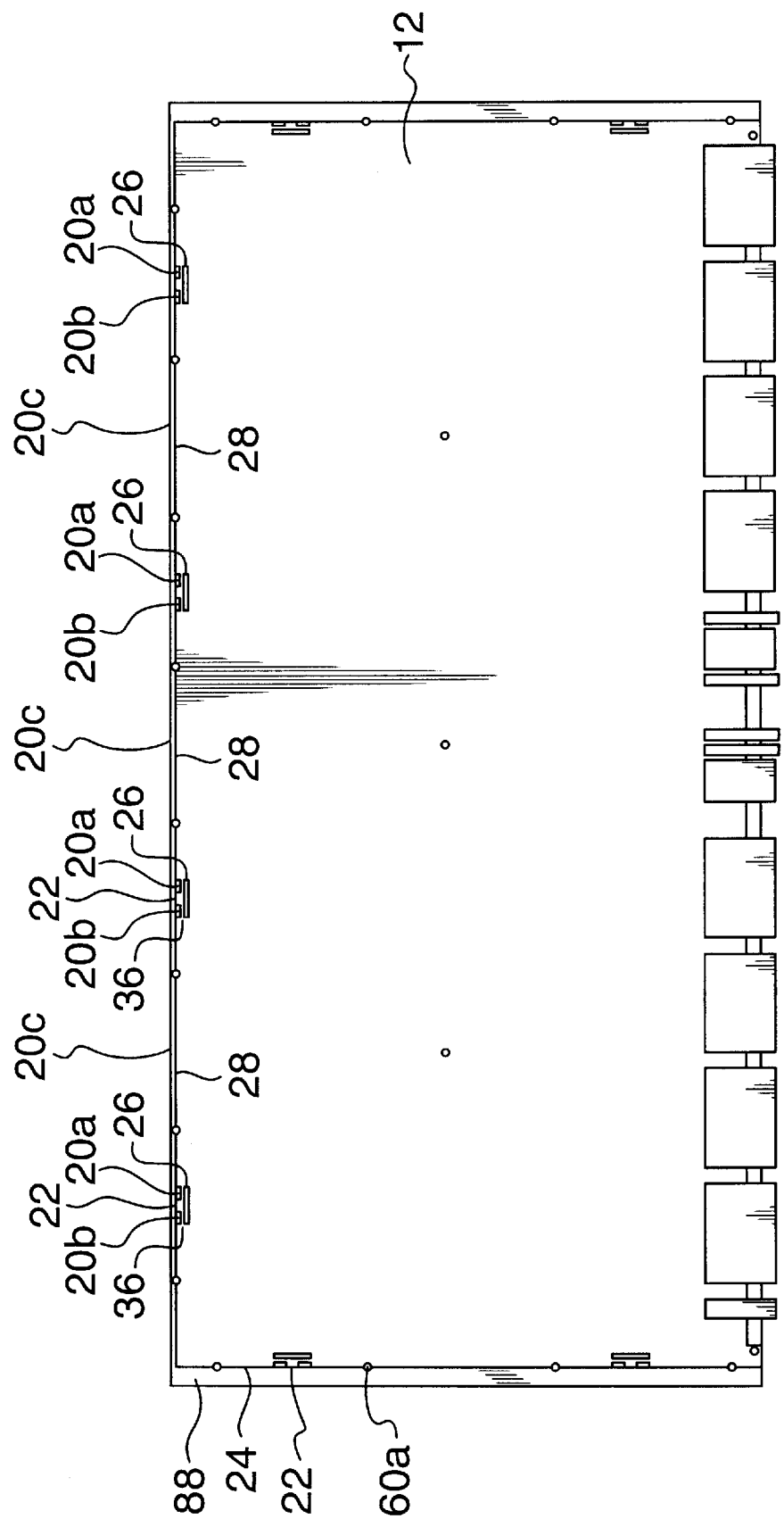
FIG. 5 is a top view of a printed circuit board of the first embodiment, without electronic components.

In FIG. 5, the end regions 20a and 20b of each outline slit 20 are spaced approximately eight inches apart and inwardly disposed about the perimeter edge 30 of the final board 12 on each side. This arrangement was chosen with regard to the balance between providing fewer outline slits 20 which would provide more space on the final board 12 for the mounting of electronic components 18 while more outline slits 20 would provide a structurally improved connection between the final board 12 and the scrap border 14. Other considerations include the size and thickness of the final board 12.

Inwardly coincident to each support tab 22 are a plurality of elongated interior slots 26. These elongated slots 26 may vary in shape, for example, being obround, rectangular, semi-circular, triangular, rhomboidal, or irregular, provided that a portion of the inner surface 34 of each elongated slot 26 immediately adjacent to the perimeter edge 30 of the final board 12, is substantially parallel thereto, and thus substantially parallel to the inner surface 33 of each of the ends regions 20a and 20b of adjacent outline slits 20.

Figure 4:
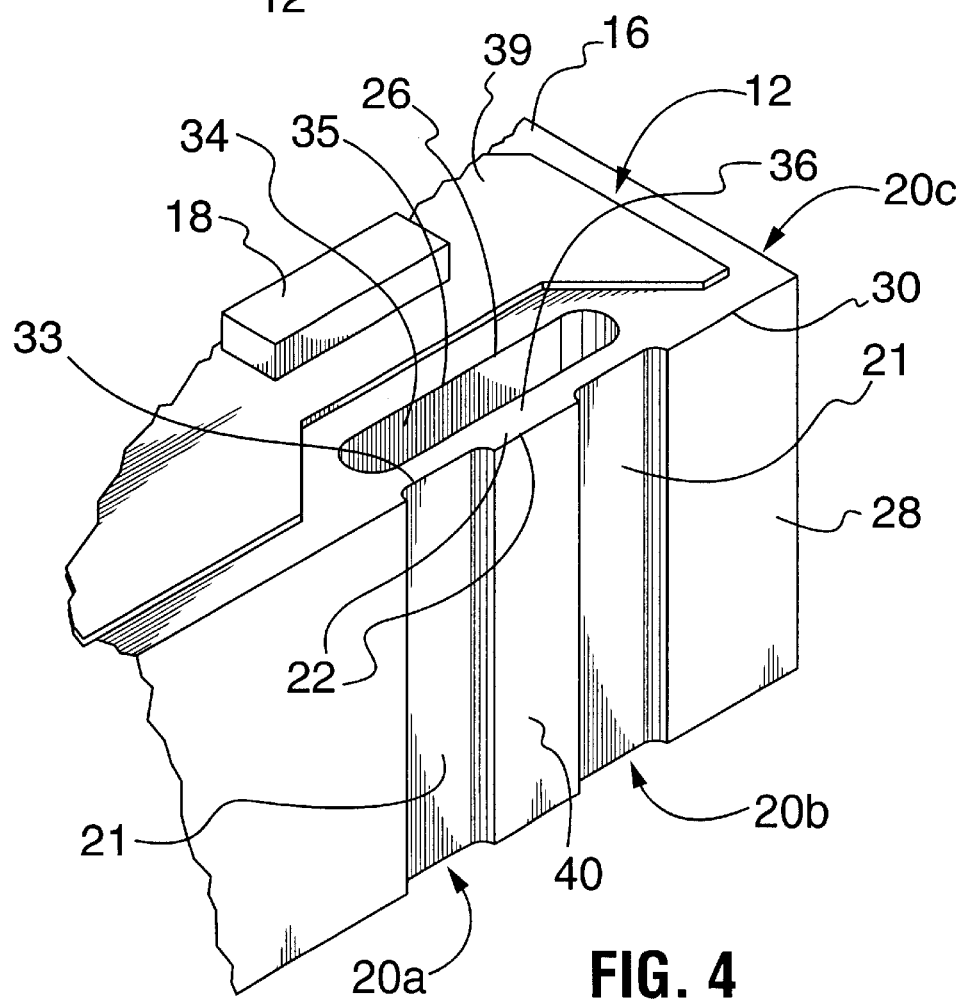
FIG. 4 is a magnified, perspective view of a section of the embodiment of FIG. 3, with scrap border removed.

FIG. 4 depicts a cross-sectional view of a final board 12 following detachment of the scrap border 14. The various conductive and signal layers are not shown.

The parallel portion 35 of the inner surface 34 of each elongated slot 26 immediately adjacent to the perimeter edge 30 of the final board 12 extends beyond the width B of the support tab 22 and, more particularly, the length E of the elongated slot 26 is preferably equal to or greater than the distance from the outermost edge from the support tab 22 of an end region 20b of a slit 20 to the opposite outermost edge from the support tab 22 of the end region 20a of an adjacent slit 20 such that the parallel sections 33 of the inner surface 32 of the end regions 20a and 20b of adjacent outline slits 20 and the inner surface 35 of the elongated slot 26 end at nearly the same points 22, and the middle of the parallel portion 35 of each elongated slot 26 coincides with the middle of each corresponding support tab 22.

The size and shape of each elongated slot 26 may vary. However, considerations such as the case of manufacture, the structural integrity of the final board 12, and the size and placement of electronic components on the final board may influence the ultimate size and shape of the elongated slot 26 used.

Figure 2:
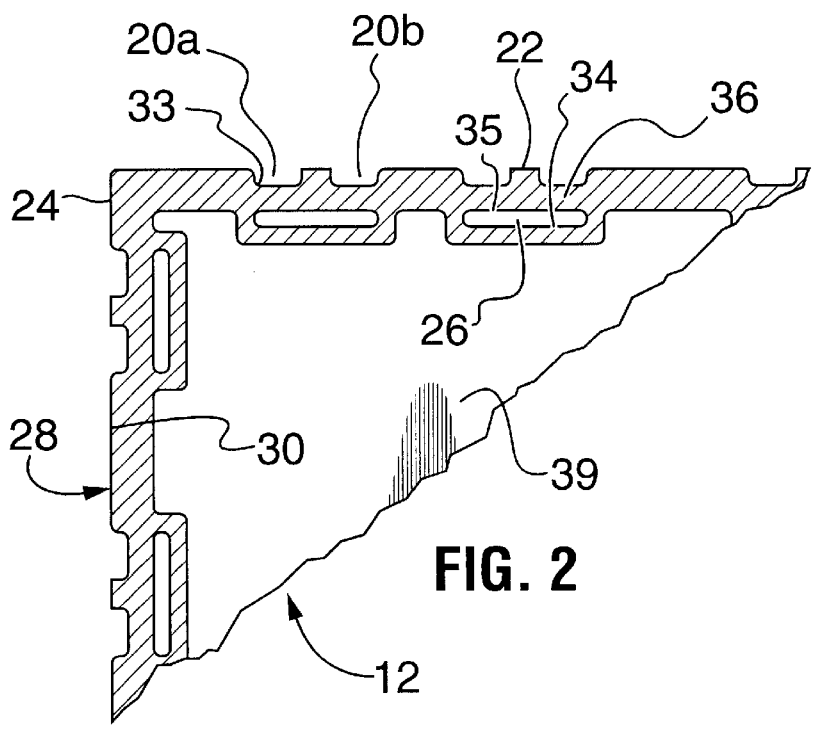
FIG. 2 is a top view of the plated printed circuit board of FIG. 1 after removal of the scrap border.

In the preferred embodiment, elongated narrow slots 26 obround in shape, having a length E of the parallel portion 35 of the inner surface 34 and a width F, are shown in FIGS. 1 and 2, and are made using a router of a standard size.

The elongated slot 26 is cut through each layer of the final board 12, exposing each conductive layer that is a ground plane. Preferably, the signal layers (not shown) and other conductive layers (not shown) of the final board 12 do not extend to the inner surfaces of each elongated slot 26 but fall short by a predetermined distance. The conductive layers intended to be used as ground planes (not shown) do extend to the inner surfaces of each interior slot 26 to be electrically connected with and merge with conductive shielding layers of the elongated slot 26, in the plating process described below.

The placement of the elongated slot 26 relative to the adjacent end regions 20a and 20b of adjacent outline slits 20 defines a web 36, which is rectangular in cross-section. The web 36 thickness is the distance D between the parallel inner surface 35 of the elongated slot 26 immediately adjacent to the perimeter edge 30 of the board and the inner surface 32 of each end region 20a and 20b of adjacent outline slits 20.

After the process panel is provided with outline slits 20, support tabs 22, and elongated slots 26, a conventional electroless step is performed which provides a conductive coating on all external surfaces of the process panel 18 including the surfaces of all outline slits 20, elongated slots 26, and all perimeter surfaces of the final board 12. The electroless process step prepares the process panel for a subsequent electroplating step.

The electroplating step involves securing an electrode clamping arrangement (not shown), on the scrap border 14, submersing the process panel into a plating bath containing ions of a highly conductive coating material, for example, copper. The clamps provide a cathode so that when an anode is inserted in the plating bath in which the process panel is suspended, in a current sufficient for electroplating, copper ions bind to all exposed surfaces, forming a conductive coating of copper in one or more layers. For example, the electroplating step provides the top 16 and bottom (not shown) outermost conductive layers; it provides a conductive layer on the perimeter surfaces 28 of the final board 12 integral with the top 16 and bottom (not shown) conductive layers, as they are formed simultaneously; and it provides a conductive layer on the inner surfaces 32 of the end regions 20a and 20b of adjacent outline slots 20 which are provided on the perimeter edges 30 of the final board 12. In addition, the copper layers forming a conductive layer on the inner surfaces 34 of the elongated slots 26 which forms an electrical contact with the exposed cut edges of all conductive layers that are ground planes in the final board 12.

In FIGS. 1, 2 and 4, a solder mask 39 is provided over central portions of the final board 12 directly atop of the top 16 and bottom (not shown) conductive layers of the final board 12 to provide surfaces on which electronic components will be mounted. A solder mask avoids contact between electronic components 18 mounted on the surface of a final board 12 with the top 16 and bottom (not shown) conductive layers of the final board 12, except through specifically provided plated-through holes (not shown) through which electrical communication with internal signal layers of the final board 12 may occur. The resulting final board 12 displays exposed copper plated surfaces about the perimeter board edge surfaces 54 and 68 depicted in FIGS. 6, 8 and 9, and centrally disposed solder masked surfaces. Such board edge surfaces 54 and 68 encompass the surface openings of the outline slits 20 and the elongated slots 26.

Freeing the final board 12 from the scrap border 14 is achieved by simply severing across each support tab 22 between adjacent end regions 20a and 20b of adjacent outline slots 20, using conventional means. The final board 12 has all perimeter surfaces, including the remaining exposed surfaces 32 of the adjacent end regions 20a and 20b of adjacent outline slits 20 (now forming recessed furrows 21), coated with conductive shielding material, the inner surfaces 34 of each elongated slot 26 also coated with conductive shielding material, and the severed support tab region 40 which is devoid of conductive shielding material.

During use of the final board 12 after manufacture, electromagnetic emissions may radiate from the final board 12 at the uncoated, unshielded surface 40 of the severed support tab 22. The coated elongated slots 26, being internally connected to the top 16 and bottom (not shown) conductive layers which operate as ground planes in the final board 12 and to the top 16 and bottom (not shown) conductive layers of the final board 12, operate to attenuate signal energies radiating through at the severed support tab 22.

Figure 3:
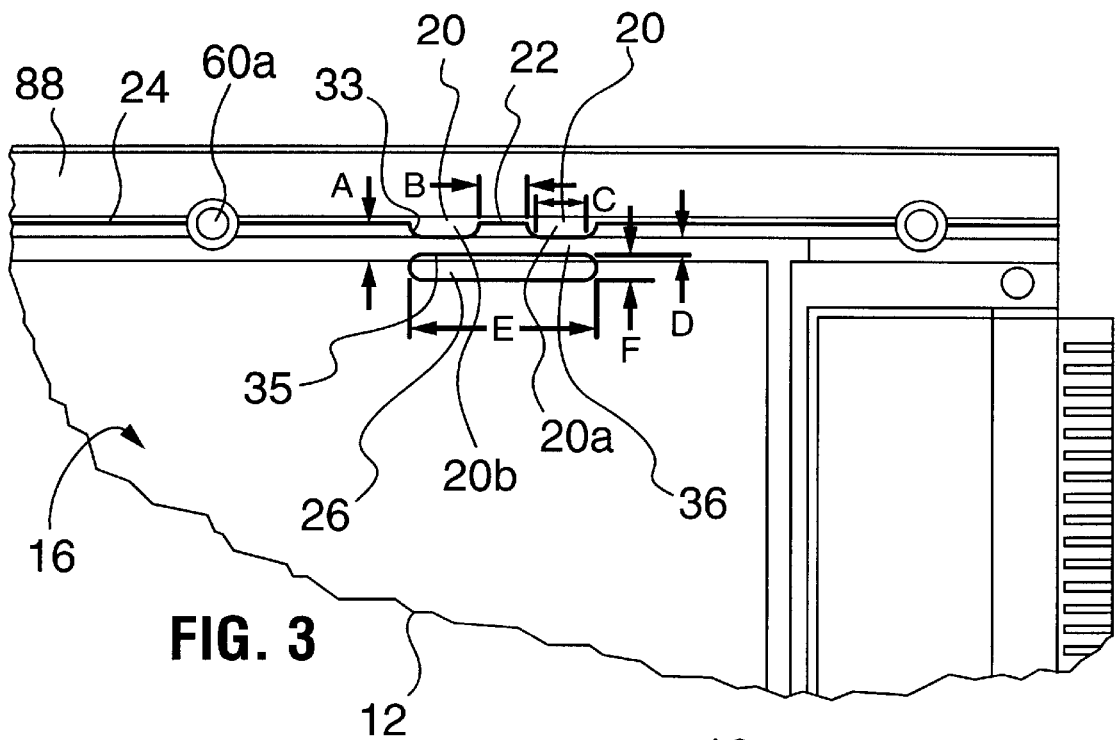
FIG. 3 is a top view of a section of a printed circuit board, in accordance with another embodiment of the invention.

Referring to FIG. 3, attenuation of various signal energies may occur by varying the dimensions for C and D. To determine the approximate frequency below which an electromagnetic field will be significantly attenuated as it attempts to propagate down the length of a rectangular waveguide (in cross-section), the following formula may be used:

$$f_o = \frac{(15) \times 10^4}{l/\varepsilon_r}$$

where
$f_o$=the cut off frequency
l=the largest linear dimension of the waveguide cross-section ε_r—the dielectric constant of the material filling the waveguide Cut-off frequencies in excess of $f_o$ will propagate freely (unattenuated), rendering the waveguide useless for those frequencies. To determine the attenuation, or effective shielding, of the non-propagating waveguide, the following equation may be used:

$$SE=27.3l/t$$

where:
l=the length of the waveguide
t=the thickness (largest linear dimension of cross-section
It will be appreciated that the cut-off frequencies for waveguides of different shapes in cross-section may be described by different equations.

Accordingly, the higher the frequencies to be attenuated, the thinner the web 36 along D must be. It will be appreciated that by increasing the length of the parallel portion 33 of the inner surface 32 of the end region 20a or 20b of outline slit 20, the better signal attenuation is accomplished. However, such an increase in length C has the additional effect of weakening the web 36. Due to manufacturing limitations and the thickness of the board, over increasing the length C may result in the final board 12 being prematurely severed from the scrap border 14.

In the particular embodiment disclosed in FIG. 1, it was observed that with dimensions of the elongated slot 26, the outline slits 20, and the web 36 as follows:
A—1.181 mm
B—4.763 mm
C—5.08 mm (wave-guide length)
D—1.524 mm (thickness of the web)
E—19.825 mm
F—2.54 mm
where the dielectric constant is 3.9, the cut-off frequency below which an electromagnetic emission will be significantly attenuated will be 49.8 gigahertz and the attenuation of the non-propagating waveguide will be 91 decibels.

With reference to FIGS. 6 to 9, an alternate embodiment of this invention, a copper-plated printed circuit board of FIG. 3 in final form has a first major surface (top) 42 and a second major surface (bottom) 44. Each major surface is provided with electronic components 18 surface-mounted to each surface.

The final board 12 is provided with two housings which encase each major surface of the final board, as described below.

With reference to the first housing 50, which is applied on the first surface, in this case, the top surface 42, of the final board 12, the first housing 50 is rectangular in shape and formed to define an interior concave surface 52 within which electronic components 18 provided on the top surface 42 of a final board 12 may be fully encased. The first housing 50 is further formed to contact the top surface 42 of the final board 12 along the perimeter edge surface 54, with all electronic components 18 carried on the top surface 42 located within the first housing 50. Referring to FIGS. 1 and 2, the perimeter edge surface 54 of the final board 12 displays exposed copper-plated surfaces.

The first housing 50 is sized to be able to overlie the entire final board 12, together with all electrical components 18, while the interior concave surface 52 is sized to overlie all electrical components 18 but not the entire final board 12.

A first electromagnetically conductive seal, or "gasket" 56, is provided along the housing perimeter surface 55 of the first housing 50 that is in contact with the top perimeter edge surface 54 of the final board 12. The first housing 50 may additionally by provided with a gasket trench 58 within which the gasket 56 may be applied. Typically, the gasket is made of a conductive elastomer containing a conductive material such as silver and is contact with the top perimeter edge surface 54 of the final board 12. The gasket 56 serves to maintain a uniform electrical contact between the housing perimeter surface 55 of the first housing 50 and the top perimeter edge surface 54 of the final board 12, thereby referencing the top surface 42 of the final board 12 to a ground. It will be appreciated that electromagnetic emissions may radiate through any gap in electrical contact between the first housing 50, the gasket 56 and/or the final board 12. As such, it is preferable that such gaps are avoided.

A clearance between the electronic components 18 and the interior concave surface 52 of the first housing 50 is provided to permit the flow of thermal conductive material.

The second housing 62 is constructed similarly with reference to the bottom surface 44 of the final board 12 and to the electrical components 18 carried thereon in a similar manner as with the first housing 50 to the top surface 42 of the final board 12. A bottom interior concave surface 66 is formed in the second housing 62 and overlies electronic components 18 provided on the bottom surface 44 of the final board 12. A second gasket 64 is also provided to maintain an electrical contact between the second housing 62 with the bottom perimeter edge surface 66 of the bottom surface 44 of the final board 12. The second housing 62 may also be provided with a second gasket trench 70 along the second housing perimeter edge (not shown) within which the second gasket 64 may be applied.

The first housing 50 and the second housing 62 will be formed so as to define a chamber 72 within which the final board 12 may be held. The second housing may be fastened to the first housing by known means including by screws 60 or clips. It is not necessary for direct physical or electrical contact to be made between the first housing 50 and second housing 62, although indirect contact through fastening means extending from one housing to the other may occur.

The first housing 50 and the second housing 62 may also serve as a heat sink, including being made of thermally conductive material such as aluminum, or be provided with an interiorly disposed heat sink surface 88. The first housing 50 and second housing 62, or interiorly disposed heat sink surface, may also be provided with fin stacks (not shown) for increased heat dissipation surface area. The use of externally situated fans may also be used to increase heat dissipation from the housing units. FIG. 3 depicts a final board 12 orientated in relation to a heat sink 88

Each housing may also be provided with holes (not shown) through which thermal overfill material (not shown) may be injected to provide a thermal conductive medium between the surface of the components 18 on the final board 12 and the first housing 50 and second 62 housing.

Where the first 50 and second 62 housings are to be used as heat sinks with thermal conductive overfill material within, it will be appreciated that each housing be additionally sized to provide a minimal clearance between the interior concave surfaces 52 and 66, and the top 42 and bottom 44 surfaces of the final board 12 to reduce the tolerance and thereby reduce the volume of overfill material required to maintain a contact between the components and the heat sink surface.

Because each housing operates independently of the other in respect of electromagnetic containment, the tolerance between the electronic components 18 and the interior concave surface 52 and 66 of the housings 50 and 62, may also be assessed independently of the other. In the embodiments depicted in FIGS. 6, 8 and 9, the first tolerance G and the second tolerance H are substantially the same. In such a case, substantially the same overfill volume can be used on each side of the final board 12.

The final board 12 may be secured between the first housing 50 and second housing 62 by known means including by a plurality of fastening means such as screws 60. It will be appreciated that the same fastening means used to secure the first housing 50 and second housing 62 to the final board may also be used to connect the first housing 50 to the second housing 62.

Figure 6:
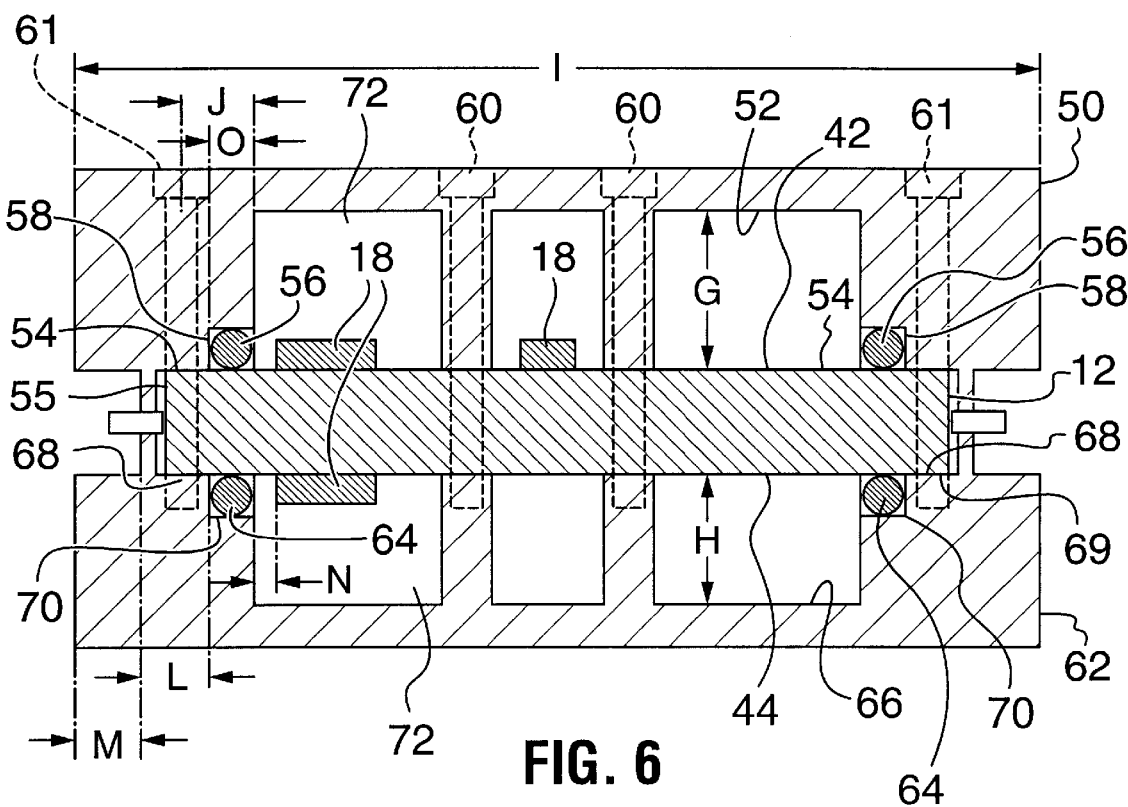
FIG. 6 is a cross-sectional view of a printed circuit board of an alternate embodiment of the invention, provided with a Faraday cage housing.
Figure 7:
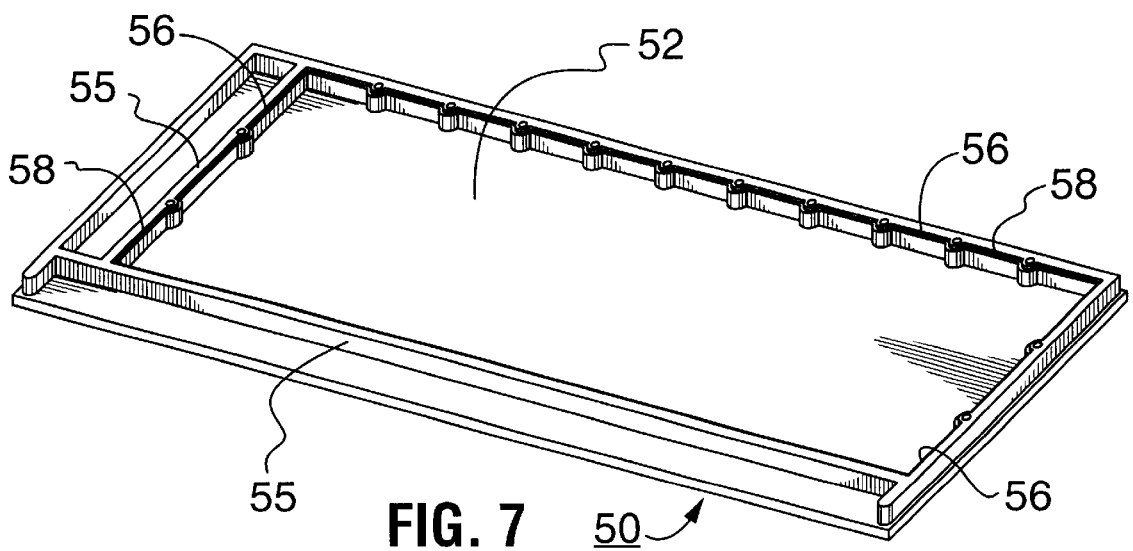
FIG. 7 is a perspective view of the underside of the Faraday cage housing of FIG. 6, provided with a gasket.

In FIGS. 3 and 6, the screws 60 fastening the first housing 50 to the second housing 62 also serves to secure the final board 12 in position between the two housing units. The final board may be provided with holes 60a for receiving the screws 60. It may be desired that the number of screws used and the positioning thereof be chosen so as to reduce warpage or stress on the final board 12. It may further be desired that certain of the screws 61 be positioned so as to assist the creation of a solid connection of the first gasket 56 and second gasket 64 with the corresponding first surface (top) 42 and second surface (bottom) 44 of the final board 12.

Figure 8:
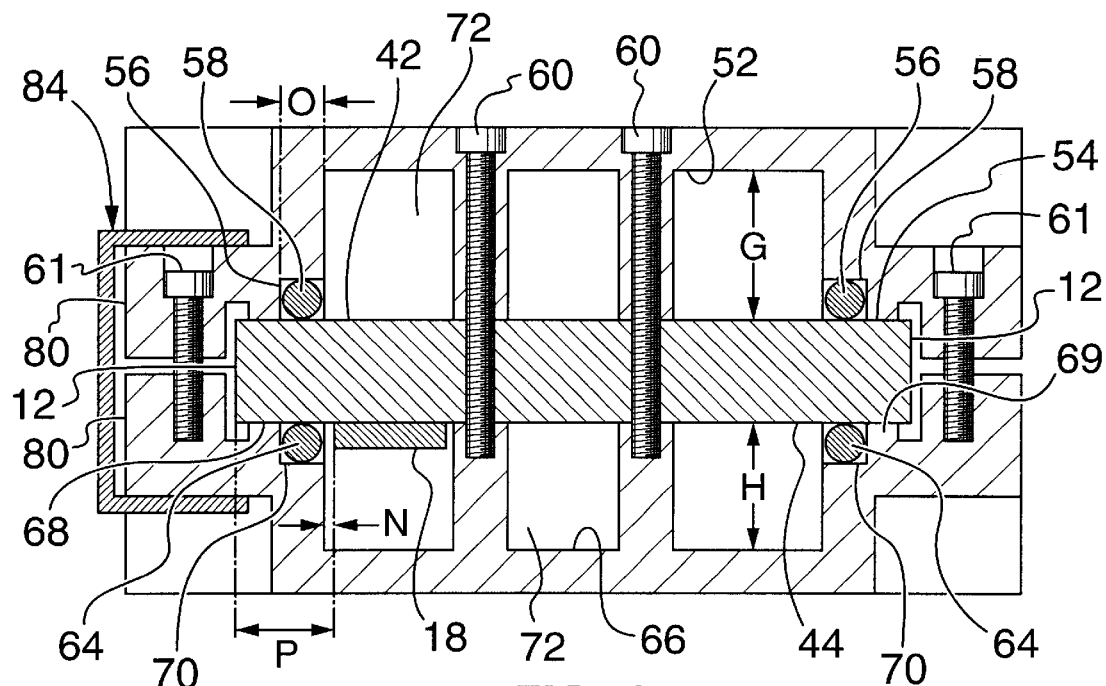
FIG. 8, is a cross-sectional view of a printed circuit board of an alternate embodiment, similar to FIG. 6.
Figure 9:
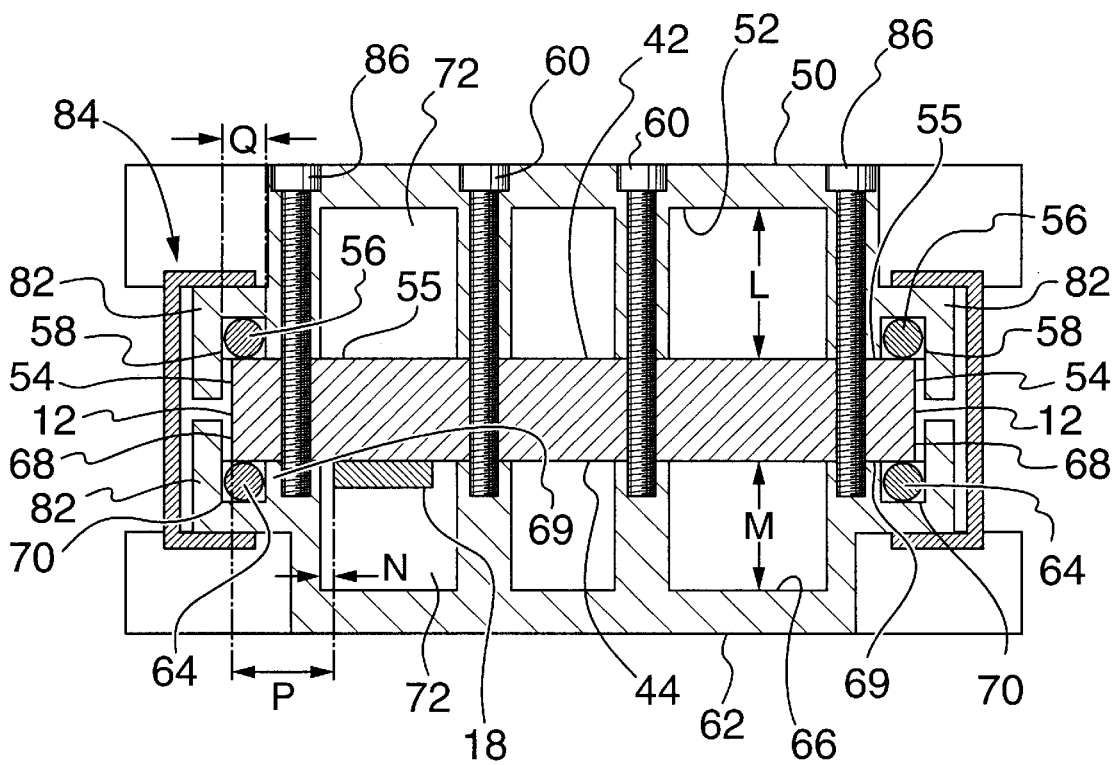
FIG. 9, is a cross-sectional view of a printed circuit board of another alternate embodiment, similar to FIG. 6.

In alternate embodiments depicted in FIGS. 8 and 9, the first housing 50 and second housing 62 are respectively provided with two flanges 80 and 82 extending from a mid-portion of opposing sides of the housings.

In FIG. 8, the flanges 80 provide a location at which screws may be used to connect the first housing 50 to the final board 12 and to the second housing 62. The flanges 80 are further adapted to provide location for manual manipulation of the housing assembly into and out of the computer system in which the housing assembly will be used. Caps 84, for example, formed of plastic, may also be provided to frictionally fit over the flanges 80 for purposes including increasing the ease of manual manipulation and to assist in maintaining the connection between the first 50 and second 62 housings.

The flanges 82 of FIG. 9 are similar to those of FIG. 6 except that a location for screws is not provided. Instead, the flanges 82 are provided with first gasket trench 56 and a second gasket trench 70 for the first gasket 56 and second gasket 64 respectively. Instead, the screws 86 are provided centrally and inward of the flanges 82 on the main surface of the first housing 50, proximate to the first 56 and second 64 gaskets.

As an example, FIG. 6 depicts a rectangular final board 12 that is 517.4 millimeters along the longest length. In profile, the first housing 50 and second housing 62 are rectangular in shape. The dimensions indicated in FIG. 6 are as follows:
I—528.9 millimeters
J—4.34 millimeters
K—2.0 millimeters
L—4.675 millimeters
M—4.0 millimeters
N—1.5 millimeters
In FIG. 8, the dimensions are varied as follows:
O—2.2 millimeters
P—6.5 millimeters
In FIG. 9, the dimensions are further varied as follows:
Q—2.0 millimeters
R—8.0 millimeters.

The present invention has been described with regard to preferred embodiments. However, it will be obvious to persons skilled in the art that numerous modifications, variations, and adaptations may be made to the particular embodiments of the invention described above without departing from the scope of the invention, which is defined in the claims.

What is claimed is:

1. A printed circuit board having a plurality of spaced apart scrap border support tabs along the perimeter of the board, the board surfaces including the board edges along said perimeter being coated with a conductive shielding material, except that each tab presents an uncoated, unshielded surface at the point of severance created by detachment of a scrap border subsequent to coating application, and wherein the printed circuit board includes a plurality of spaced apart elongated apertures adjacent said perimeter, with each aperture being inwardly coincident to a respective one of each of said support tabs, each said aperture defining an inner surface adjacent to the corresponding support tab with a portion of said inner surface being substantially parallel to adjacent perimeter portions of the circuit board, said inner surface of each said aperture also being coated with the conductive shielding material with the latter being attached to the conductive shielding material of the board surface, such that a waveguide configuration is created which serves to attenuate electromagnetic emissions entering into or leaving the printed control board at the corresponding uncoated unshielded surface portions of the support tab during use of the printed circuit board.

2. The printed circuit board of claim 1 wherein the adjacent perimeter portions of the board include shallow recesses disposed in flanking relation to each said support tab with each said recess defining a recess surface extending in closely spaced parallel proximity to said portion of the inner surface of the elongated aperture associated therewith.

3. The printed circuit board of claim 2 wherein each said aperture is in the form of an elongated narrow slot extending parallel to the adjacent board perimeter, the opposing ends of which slot extend beyond opposing distal ends of said shallow recesses which flank the corresponding tab.

4. The printed circuit board of claim 3 wherein said conductive shielding material comprises one or more electroplated layers.

5. The printed circuit board of claim 4 wherein each said electroplated layer comprises copper.

6. The printed circuit assembly provided with a scrap border detachably connected to the perimeter of a printed circuit board by a plurality of spaced apart support tabs, all of which including the perimeter edges of the board are coated with a conductive shielding material during manufacture, the scrap border being detachable from the printed circuit board subsequent to coating by severance of said tabs whereby each tab presents an uncoated, unshielded surface at the point of severance, and wherein the printed circuit board includes a plurality of spaced apart elongated apertures adjacent said perimeter, with each aperture being inwardly coincident to a respective one of each of said support tabs, each said aperture defining an inner surface adjacent to the corresponding support tab, with a portion of said inner surface being substantially parallel to adjacent perimeter portions of the circuit board, with the entire inner surface of each said aperture also being coated with the conductive shielding material during manufacture, with the latter being attached to the conductive shielding material on the board surfaces, such that a waveguide configuration is created which serves to attenuate electromagnetic emissions entering into or leaving the printed control board at the uncoated unshielded surface portions of the corresponding support tab during use of the printed circuit board.

7. The printed circuit board assembly of claim 6 wherein the adjacent perimeter portions of the board include shallow recesses disposed in flanking relation to each said support tab with each said recess defining a recess surface extending in closely spaced parallel proximity to said portion of the inner surface of the elongated aperture associated therewith.

8. The printed circuit board assembly of claim 7 wherein each said aperture is in the form of an elongated narrow slot extending parallel to the adjacent board perimeter, the opposing ends of which slot extend beyond opposing distal ends of said shallow recesses which flank the corresponding tab.

9. The printed circuit board assembly of claim 8 wherein said conductive shielding material comprises one or more electroplated layers.

10. The printed circuit board assembly of claim 9 wherein each said electroplated layer comprises copper.

* * * * *